United States Patent [19]
Tang et al.

[11] Patent Number: 6,023,426
[45] Date of Patent: Feb. 8, 2000

[54] METHOD OF ACHIEVING NARROW $V_T$ DISTRIBUTION AFTER ERASE IN FLASH EEPROM

[75] Inventors: Yuan Tang; James C. Yu, both of San Jose; Chien-Sheng Su, Saratoga, all of Calif.

[73] Assignee: Eon Silicon Devices, Inc., Santa Clara, Calif.

[21] Appl. No.: 09/036,971

[22] Filed: Mar. 9, 1998

[51] Int. Cl.[7] .................................................. G11C 16/04
[52] U.S. Cl. ............................... 365/185.3; 365/185.24; 365/185.29
[58] Field of Search ........................... 365/185.3, 185.24, 365/185.29, 218

[56] References Cited

U.S. PATENT DOCUMENTS

| | | | |
|---|---|---|---|
| 5,535,158 | 7/1996 | Yamagata | 365/185.29 |
| 5,574,686 | 11/1996 | Watsuji et al. | 365/185.23 |
| 5,742,541 | 4/1998 | Tanigami et al. | 365/185.3 |
| 5,805,499 | 9/1998 | Haddad | 365/185.19 |
| 5,815,438 | 9/1998 | Haddad et al. | 365/185.17 |

*Primary Examiner*—David Nelms
*Assistant Examiner*—Hien Nguyen
*Attorney, Agent, or Firm*—Davis Chin

[57] ABSTRACT

There is provided a method of correcting overerased memory cells in a flash EEPROM memory cell after erase so as to produce a narrow threshold voltage distribution width. A ground potential is applied to all of the sources and substrates of the cells in the array of memory cells. First positive pulse voltages are simultaneously applied to each word line in a first timed sequence on a word line by word line basis. A second positive pulse voltage is simultaneously applied to each bit line in a second timed sequence in a bit line by bit line basis when the first positive pulse voltages are being applied to a first word line and is then repeated for each subsequent word line until a last word line is applied.

10 Claims, 2 Drawing Sheets

Fig. 1 (Prior Art)
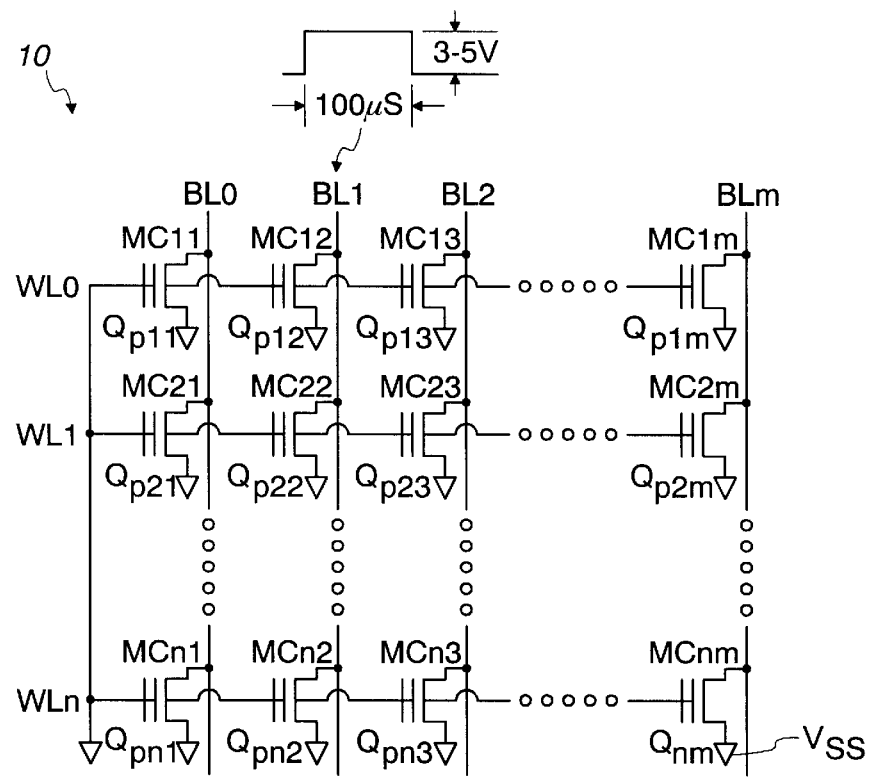
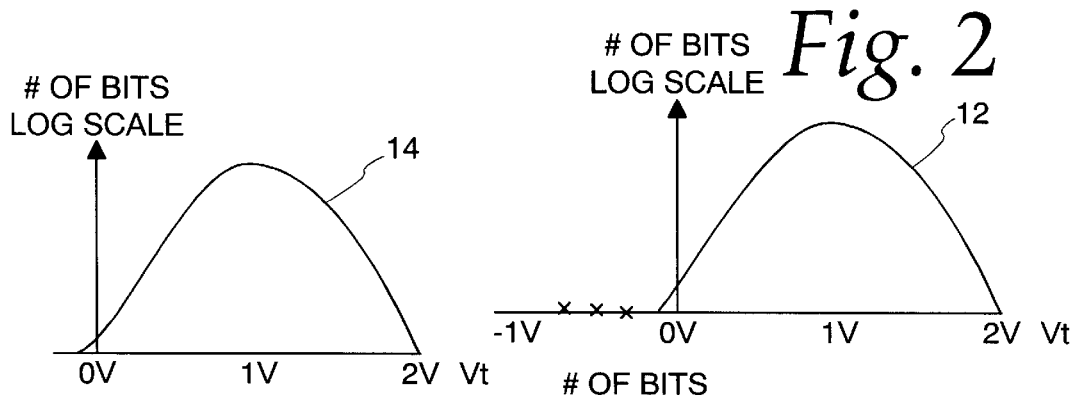
Fig. 2
Fig. 3
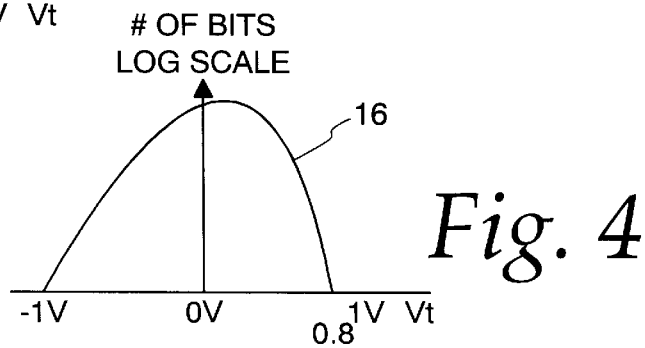
Fig. 4

Fig. 5
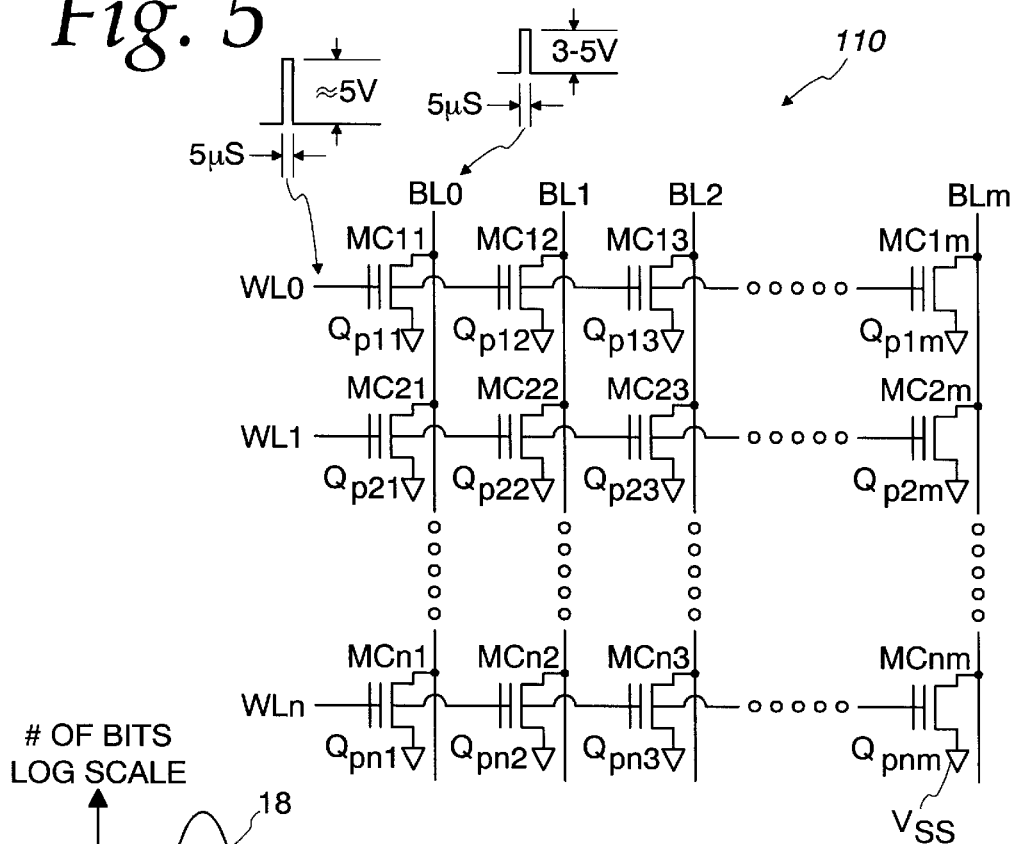
Fig. 6
Fig. 7
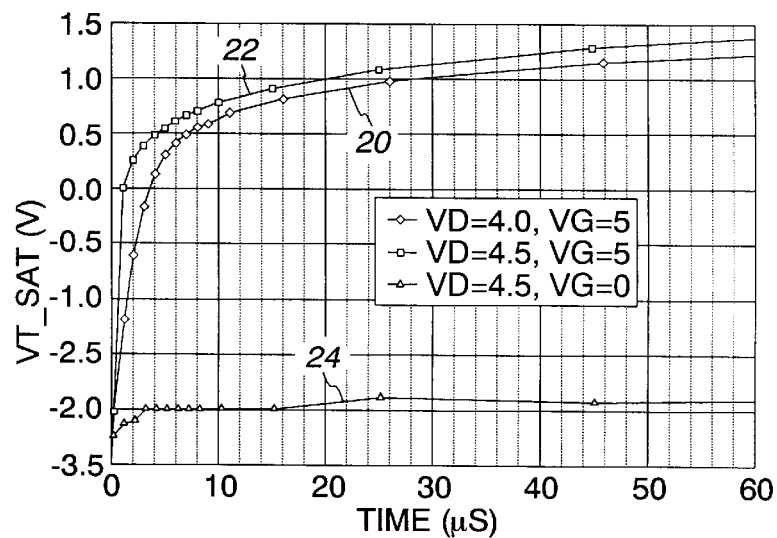

METHOD OF ACHIEVING NARROW $V_T$ DISTRIBUTION AFTER ERASE IN FLASH EEPROM

BACKGROUND OF THE INVENTION

1. Field of the Invention

This invention relates generally to non-volatile memory devices having a floating gate such as an array of flash electrically erasable and programmable read-only memory (EEPROMs) devices. More particularly, the present invention relates to a new and novel method of achieving a narrow threshold voltage distribution after erase in a flash EEPROM.

2. Description of the Prior Art

One type of non-volatile memory device is referred to as "flash EEPROMs" which are both programmable and erasable electrically. In these flash memories, a plurality of one-transistor flash EEPROM cells may be formed on a P-type semiconductor substrate in which each is comprised of an N-type source region and an N-type drain region both formed integrally within the substrate. A relatively thin gate dielectric layer is interposed between a top surface of the substrate and a conductive polysilicon floating gate. A polysilicon control gate is insulatively supported above the floating gate by a second dielectric layer. A channel region in the substrate separates the source and drain regions.

In a conventional operation, in order to program a flash EEPROM cell high gate-to-drain voltage pulses are applied to the cell while the source thereof is grounded. For example, during programming multiple voltage pulses of approximately 10 V are each applied for about 2 or 3 $\mu S$ to the control gate while the drain voltage is set to +5.5 V and its source is grounded. The high gate-to-drain voltage pulses produce "hot" (high energy) electrons into the channel region near the drain region. These "hot" electrons are accelerated across the thin gate dielectric layer into the floating gate, thereby increasing the threshold voltage by three to five volts. The term "threshold" refers to a gate-to-source voltage that must be applied between the gate and the source of the cell in order to cause it to conduct.

In order to erase the flash EEPROM cell, relatively high negative gate-to-source voltage pulses are applied for a few tenths of a second to the cell. For example, during erase multiple voltage pulses of approximately –10 V are each applied to the control gate while the source voltage is set to +5.5 V and its drain is floating. The high negative gate-to-source voltage pulses cause the electrons to be extracted from the floating gate through the gate dielectric layer to the source region by way of Fowler-Norheim (F-N) tunneling, thereby reducing the threshold voltage of the cell.

As is generally well-known in the art, the threshold voltage of each single-transistor flash EEPROM cell after erase in the flash memory is variable. A large variation or wide distribution of the threshold voltages $V_T$ after erasure is one of the most considered problems in performance possessed by EEPROM devices. The distribution of the threshold voltages $V_T$ among the individual cells in the EEPROM array having floating-gate memory cells arrayed in rows and columns is caused by process variations, including local variations in the tunnel oxide thickness, the area of tunneling region, and the capacitive coupling ratio between the control gates and the floating gates as well as variations in the strengths of the erasing pulses.

If an unprogrammed flash EEPROM cell in the array of such cells is repeatedly erased under the above described conditions, the floating gate will eventually acquire a more positive potential so that the erase threshold voltage $V_T$ on a given column (bit line) will be less than zero. As a result, even with the control gate being grounded the cell will be conductive which causes column leakage so as to prevent the proper reading of any other cell in the column of the array containing this cell as well as making programming of other cells in the same column increasingly more difficult. This condition is generally referred to as "bit overerase" which is disadvantageous since the data programming characteristics of the memory cell is deteriorated so as to cause endurance failures. As used herein, the term "endurance" refers to the number of times the memory cell may be reprogrammed and erased. Consequently, the "bit overerase" condition significantly reduces the endurance of the memory cell.

There have been various techniques developed in the prior art of correcting the problem of overerased cells, but they all generally suffer from a number of drawbacks or introduce other problems. One such prior art correction technique for correcting overerased bits in an array of flash EEPROM memory cells is illustrated in FIG. 1. For the purposes of completeness, reference is made to a technical paper authored by Seiji Yamada et al. and entitled "A Self-Convergence Erase for NOR Flash EEPROM Using Avalanche Hot Carrier Injection," IEEE Transactions on Electron Devices, Vol. 43, No. 11, November 1996, pp. 1937–1941, which discusses in detail the over-erase correction method through channel hot-electron mechanism. As can be seen, a flash EEPROM array 10 is formed of a plurality of memory cells MC11 through MCnm arrayed in an n×m matrix on a single integrated circuit chip.

In other words, the memory array 10 includes approximately 128 thousand cells arranged in a regular matrix pattern of $2^9$ rows and $2^8$ columns. The memory cells MC11 through MC1m are arranged in the same row and have their selection terminals connected to the common word line WL0. Similarly, the cells MC21–MC2m are arranged in the same row and have their selection terminals connected to the common word line WL1. This is likewise done for each of the remaining rows in the array 10. Thus, the cells MCn1 through MCnm are arranged in the same row and have their selection terminals connected to the common word line WLn. In addition, the memory cells MC11 through MCn1 are arranged in the same column and have their data terminals connected to the common bit line BL0. Similarly, the cells MC12 through MCn2 are arranged in the same column and have their data terminals connected to the common bit line BL1. This is likewise done for each of the remaining columns in the array 10. Thus, the cells MC1m through MCnm are arranged in the same column and have their data terminals connected to the common bit line BLm.

Each of the memory cells MC11 through MCnm is comprised of one of the corresponding floating gate array transistors $Q_{P11}$ through $Q_{Pnm}$. The array transistors $Q_{P11}$–$Q_{Pnm}$ function as a memory transistor for storing data "1" or "0" therein. Each of the array transistors $Q_{P11}$–$Q_{Pnm}$ has its gate connected to one of the rows of word lines WL0–WLn, its drain connected to one of the columns of bit lines BL0–BLm, and its source connected to an array ground potential VSS.

After the flash memory array 10 has been erased, the prior art correction technique of correcting the overerased bits is performed on the array columns detected to have column leakage indicative of an overerased bit. Assume that the column or bit line BL1 was detected to contain an overerased bit. Then voltage pulses having a magnitude of approximately 3–5 volts and a width of approximately 100 μS are applied to the bit line BL1 with the column leakage occurring while all of the word lines WL1–WLn, the common sources, and the substrate are grounded until the common leakage current is reduced.

This prior art overerased correction technique is only effective if the distribution of the erased threshold voltages $V_T$ is similar to the one illustrated in FIG. 2. The graph of FIG. 2 shows a threshold voltage distribution for the Flash EEPROM array having few overerased cells with a very negative $V_T$ (between −1 volts to 0 volts). The horizontal axis is the threshold voltage in volts, and the vertical axis represents the number of cells. Therefore, the curve 12 represents a plot of the number of cells in the array having a particular threshold voltage $V_T$. It will be noted that most of the cells have not been overerased and thus have a positive threshold voltage and that only few cells have a negative threshold voltage. Further, the X's represent a few scattered well overerased cells. As a result, the application of the prior art correction technique will produce a threshold voltage distribution curve 14 of FIG. 3, where substantially all of the cells have a positive threshold voltage $V_T$.

However, this prior art overerased correction technique suffers from the drawback of being ineffective in bringing back overerased cells having a slightly negative voltage $V_T$, as depicted in FIG. 4, to a slightly positive value. As can be seen, the curve 16 represents a distribution where numerous cells have a slightly negative threshold voltage $V_T$ (just slightly below 0 volts). While each cell may contribute only 1 μA of column leakage current, these cells together will have hundreds of microamps of leakage current. Consequently, the prior art overerased correction technique will be unable to reduce this column leakage current since all of the leaky bits have a threshold voltage slightly below 0 volts.

Accordingly, there has arisen a need to provide a new and novel method for correcting or bringing back overerased memory cells having either a very negative threshold voltage or a slightly negative threshold voltage to a positive value in an array of flash EEPROM memory cells after erase. The present invention represents a significant improvement over the aforementioned prior art correction technique of FIG. 1.

SUMMARY OF THE INVENTION

Accordingly, it is a general object of the present invention to provide a method for correcting overerased memory cells in an array of flash EEPROM memory cells after erase on an efficient and effective basis.

It is an object of the present invention to provide a method for correcting overerased memory cells having both a very negative threshold voltage and a slightly negative threshold voltage to a positive value in an array of flash EEPROM memory cells after erase.

It is another object of the present invention to provide a method for correcting overerased memory cells in an array of flash EEPROM memory cells after an erase operation so as to render improved high endurance.

It is still another object of the present invention to provide a method of achieving a narrow threshold voltage distribution after erase in a flash EEPROM memory array.

In accordance with these aims and objectives, the present invention is concerned with the provision of a semiconductor integrated circuit memory device having a correction structure for performing a correction operation on overerased memory cells in the memory device after erase. The correction structure includes a cell matrix having a plurality of memory cells arranged in rows of word lines and columns of bit lines intersecting the rows of word lines. Each of the memory cells includes a floating gate array transistor which has its control gate connected to one of the rows of word lines, its drain connected to one of the columns of bit lines, and its source and substrate connected to a ground potential.

The correction structure includes first positive pulse voltages which are applied to each word line in a first timed sequence on a word line by word line basis. A second positive pulse voltage is simultaneously applied to each bit line in a second timed sequence on a bit line by bit line basis when the first positive pulse voltages are being applied to a first word line and is then repeated for each subsequent word line until a last word line is applied.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a schematic circuit diagram of a portion of a memory device having a flash EEPROM memory array 10 to which a conventional correction technique is applied after erase;

FIG. 2 is a graph of a threshold voltage distribution for a flash EEPROM memory array after erase with very negative threshold voltages;

FIG. 3 is a graph of a threshold voltage distribution for a flash EEPROM memory array after the conventional correction technique of FIG. 1 has been employed;

FIG. 4 is a graph of a threshold voltage distribution for a flash EEPROM memory array after erase with numerous cells having slightly negative threshold voltages;

FIG. 5 is a schematic circuit diagram of a portion of a memory device having a flash EEPROM memory array 110 to which a correction method of the present invention is applied after erase;

FIG. 6 is a graph of a threshold voltage distribution for a flash EEPROM memory array after the correction method of FIG. 5 has been employed; and FIG. 7 are graphs of the threshold voltages of an overerased memory cell as a function of the number of applied pulses for different bias conditions.

DESCRIPTION OF THE PREFERRED EMBODIMENT

A new and novel method for correcting overerased memory cells in an array of flash EEPROM memory cells fabricated on a semiconductor integrated circuit substrate is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits and control lines, not particularly relevant to the understanding of the operating principles of the present invention, have been purposely omitted for the sake of clarity.

Referring now in detail to the drawings, there is shown in FIG. 5 a schematic circuit diagram of a portion of a semiconductor integrated circuit memory device having a flash EEPROM memory array 110 to which a new and novel correction method of the present invention is applied after erase so as to obtain a narrow threshold voltage $V_T$ distribution. Unlike the traditional prior art correction technique used in FIG. 1, the correction method of the present invention is capable of correcting or bringing back both cells with very negative threshold voltages and cells with slightly negative threshold voltages to a positive threshold voltage on an efficient and effective basis. After the present correction method is applied to the flash EEPROM memory array 110 as illustrated in FIG. 5, there is obtained a threshold voltage distribution which is narrower (only approximately 1 V) than the distribution achieved by the conventional correction technique of FIG. 1.

The flash EEPROM memory array 110 is formed of a plurality of memory cells MC11 through MCnm arranged in an n×m matrix on a single semiconductor substrate by known CMOS integrated circuit technology. It should be noted that the structural circuit components and their interconnection of the memory array 110 of FIG. 5 is identical to the memory array 10 of FIG. 1. In particular, the memory array 110 includes, as an example, approximately 128 thousand cells arranged in a regular matrix pattern of $2^9$ rows and $2^8$ columns.

The memory cells MC11 through MC1m are arranged in the same row and have their selection terminals connected to the common word line WL0. Similarly, the cells MC21 through MC2m are arranged in the same row and have their selection terminals connected to the common word line WL1. This is likewise done for each of the remaining rows in the array 110. Thus, the memory cells MCn1 through MCnm are arranged on the same row and have their selection terminals connected to the common word line WLn. Furthermore, the memory cells MC11 through MCn1 are arranged in the same column and have their data terminals connected to the common bit line BL0. Similarly, the cells MC12 through MCn2 are arranged in the same column and have their data terminals connected to the common bit lines BL1. This is likewise done for each of the remaining columns in the array 110. Thus, the memory cells MC1m through MCnm are arranged in the same column and have their data terminals connected to the common bit line BLm.

Each of the memory cells MC11 through MCnm is comprised of one of the corresponding floating gate array transistors $Q_{P11}$ through $Q_{Pnm}$. The array transistors $Q_{P11}$ through $Q_{Pnm}$ function as a memory transistor for storing data "1" or "0" therein. Each of the array transistors $Q_{P11}$–$Q_{Pnm}$ has its gate connected to one of the rows of word lines WL0–WLn, its drain connected to one of the columns of bit lines BL0–BLm, and its source connected to an array ground potential VSS.

The improved correction method of the present invention will now be explained. Initially, it is assumed that all of the memory cells MC11–MCnm in the array 110 have been erased due to a previous erase operation. Further, it is assumed that the $V_T$ distribution after erase is similar to the one illustrated in FIG. 4, where there exists numerous overerased cells having slightly negative $V_T$. As will be recalled, this is the type of distribution where application of the conventional prior art correction technique to the memory array would be ineffective in correcting the overerased cells.

In order to implement this improved method of the present invention, all of the sources of the array transistors as well as the substrates remain joined to the array ground potential VSS, which is at 0 volts. Next, a plurality of control gate pulses each having a magnitude of approximately +5.0 volts and a width of about 5 $\mu$S are applied to each of the word lines WL0–WLn in a first timed sequence manner (word line by word line). Simultaneously, as the control gate pulses are being applied to the first word line WL0, drain pulses each having a magnitude in the range of 3 to 5 volts and a width of about 5 $\mu$S are applied to each bit line BL0–BLm in a second timed sequence manner (bit line by bit line).

In other words, a first control gate pulse and a first drain pulse are applied simultaneously to the first word line WL0, first bit line BL0; next, to the first word line WL0, second bit line BL1; and so on to the first word line, the last bit line BLm. Then, the control gate and drain pulses are applied simultaneously to the second word line WL1, first bit line BL0; next, to the second word line WL1, second bit line BL1; and so on to the second word line, last bit line BLm. This process is repeated for each of the remaining rows of word lines WL2 through WLn and is terminated after the last word line WLn and the last bit line BLm. This sequence just described is analogous to that of reading the lines on a page of a book.

It should be understood that the remaining word lines and bit lines of the non-selected memory cells in the memory array which are not being corrected will be either left floating or may be connected to a ground potential when the selected memory cell has applied simultaneously the control gate pulse and drain pulse. For instance, when the selected memory cell MC11 is being corrected by applying simultaneously the control gate pulse to the word line WL0 and the drain pulse to the bit line BL0, the remaining word lines WL1–WLn and the bit lines BL1–BLm of the non-selected memory cells MC12 through MCnm in the memory array 110 will be left either floating or connected to the ground potential.

The amount of time that is required for this correction method of the present invention is approximately 5 $\mu$S multiplied by the number of bits in the memory array. For example, an array having 64 K bytes would require a correction time of approximately 0.3 seconds. Typically, the amount of time necessary to perform a bulk erase operation on such a memory array is in the range of 300 mS to 500 mS. Therefore, the total time for erase and correction is still somewhat less than one second, which is sufficiently acceptable.

In FIG. 6, there is shown a graph of a threshold voltage distribution for the flash EEPROM memory array 110 of FIG. 5 after the present correction method has been employed. As can be seen, the curve 18 of FIG. 6 has a narrow distribution which is only about 1 volt wide rather than the 2 volt wide distribution obtained using the prior art correction technique. In particular, the $V_T$ distribution of FIG. 6 is between a positive 0.3 volts to about +1.0 volts.

In FIG. 7, there are plotted the threshold voltages of an overerased memory cell as a function of the correction time (number of applied pulses) for three different bias conditions. The curve 20 has bias conditions of +4.0 volt pulses applied to its drain and +5.0 volt pulses applied to its control gate. The curve 22 has bias conditions of +4.5 volt pulses applied to its drain and +5.0 volt pulses applied to its control gate. The curve 24 has bias conditions of +4.5 volt pulses applied to its drain and 0 volts applied to its control gate, which is quite similar to the bias conditions under the conventional method of FIG. 1.

As can be observed from the curve 22 after 5 $\mu$S the threshold voltages on the lower end (i.e., ≈−2.2 V) will be shifted to about +0.3 volts. It will be noted by comparing the curves 20, 22 with the curve 24 that when the bias condition on the control gate is larger than zero volts the correction method of the present invention is capable of bringing back quickly an overerased bit having slightly negative threshold voltages $V_T$ back to above zero. Moreover, this FIG. 7 shows that the correction method of the present invention is fast enough to correct over-erased cells on a bit-by-bit basis (instead of the bit line-by-bit line basis of the prior art).

From the foregoing detailed description, it can thus be seen that the present invention provides a method of correcting overerased memory cells in a flash EEPROM memory device after erase so as to produce a narrow threshold voltage distribution. The correction method of the present invention is achieved by applying first positive pulse voltages to each word line in a first timed sequence on a word line by word line basis. Simultaneously, a second positive pulse voltage is applied to each bit line in a second timed sequence on a bit line by bit line basis when the first positive pulse voltages are being applied to the first word line. This process is then repeated for each subsequent word line until the last word line is applied.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor integrated circuit memory device having a correction structure for performing a correction operation on overerased memory cells in the memory device after erase, said correction structure comprising, in combination:
    a cell matrix having a plurality of memory cells arranged in rows of word lines and columns of bit lines intersecting said rows of word line, each of said memory cells including a floating gate array transistor having its control gate connected to one of said rows of word lines, its drain connected to one of said columns of bit lines, and its source and substrate connected to a ground potential;
    means for applying first positive pulse voltages to each word line in a first timed sequence on a word line by word line basis;
    means for simultaneously applying a second positive pulse voltage to each bit line in a second timed sequence on a bit line by bit line basis when said first positive pulse voltages are being applied to a first word line and is then repeated for each subsequent word line until a last word line is applied;
    said first positive pulse voltages each having a magnitude of approximately +5.0 volts; and
    said second positive pulse voltages each having a magnitude of approximately +4.5 volts.

2. In a semiconductor integrated circuit memory device as claimed in claim 1, wherein said overerased cells have threshold voltages which are only slightly negative.

3. In a semiconductor integrated circuit memory device as claimed in claim 1, wherein said overerased cells have a threshold voltage distribution after correction which is less than 1 volt in magnitude.

4. In a semiconductor integrated circuit memory device as claimed in claim 3, wherein the magnitude of the threshold voltage distribution has a range of +0.3 volts and +1.0 volts.

5. A method of correcting overerased memory cells in a flash EEPROM memory cell after erase so as to produce a narrow threshold voltage distribution width, said memory device including an array of memory cells in which each cell has a control gate, floating gate, drain, source and substrate, said memory cells being arranged in rows of word lines and columns of bit lines intersecting said rows of word lines, said method comprising the steps of:
    applying a ground potential to all of the sources and substrates of the cells in the array of memory cells;
    applying first positive pulse voltages each having a magnitude of approximately +5.0 volts to each word line in a first timed sequence on a word line by word line basis; and
    simultaneously applying a second positive pulse voltage each having a magnitude of approximately +4.5 volts to each bit line in a second timed sequence on a bit line by bit line basis when said first positive pulse voltages are being applied to a first word line and is then repeated for each subsequent word line until a last word line is applied.

6. A method of correcting overerased memory cells as, claimed in claim 5, wherein said overerased cells have threshold voltages which are only slightly negative.

7. A method of correcting overerased memory cells as claimed in claim 5, wherein said overerased cells have a threshold voltage distribution after correction which is less than 1 volt in magnitude.

8. A method of correcting overerased memory cells as claimed in claim 7, wherein the magnitude of the threshold voltage distribution has a range of +0.3 volts and +1.0 volts.

9. In a semiconductor integrated circuit memory device having a correction structure for performing a correction operation on overerased memory cells in the memory device after erase, said correction structure comprising, in combination:
    a cell matrix having a plurality of memory cells arranged in rows of word lines and columns of bit lines intersecting said rows of word line, each of said memory cells including a floating gate array transistor having its control gate connected to one of said rows of word lines, its drain connected to one of said columns of bit lines, and its source and substrate connected to a ground potential;
    means for applying first positive pulse voltages to each word line in a first timed sequence on a word line by word line basis;
    means for simultaneously applying a second positive pulse voltage to each bit line in a second timed sequence on a bit line by bit line basis when said first positive pulse voltages are being applied to a first word line and is then repeated for each subsequent word line until a last word line is applied;
    said first pulse voltages each having a magnitude of approximately +5.0 volts and a width of about 5 $\mu S$; and
    said second positive pulse voltage having a magnitude in the range of +3.0 to +5.0 volts and a width of about 5 $\mu S$.

10. A method of correcting overerased memory cells in a flash EEPROM memory cell after erase so as to produce a narrow threshold voltage distribution width, said memory device including an array of memory cells in which each cell has a control gate, floating gate, drain, source and substrate, said memory cells being arranged in rows of word lines and columns of bit lines intersecting said rows of word lines, said method comprising the steps of:

applying a ground potential to all of the sources and substrates of the cells in the array of memory cells;

applying first positive pulse voltages each having a magnitude of approximately +5.0 volts and a width of about 5 $\mu S$ to each word line in a first timed sequence on a word line by word line basis; and simultaneously applying a second positive pulse voltage having a magnitude in the range of +3.0 to +5.0 volts and a width of about 5 $\mu S$ to each bit line in a second timed sequence on a bit line by bit line basis when said first positive pulse voltages are being applied to a first word line and is then repeated for each subsequent word line until a last word line is applied.

* * * * *